United States Patent [19]

Estes et al.

[11] Patent Number: 5,420,378
[45] Date of Patent: May 30, 1995

[54] PRINTED CIRCUIT BOARD/CHASSIS GROUNDING APPARATUS AND METHODS

[75] Inventors: H. Scott Estes; Michael Ohlinger; N. Deepak Swamy, all of Austin, Tex.

[73] Assignee: Dell USA, L.P., Austin, Tex.

[21] Appl. No.: 274,872

[22] Filed: Jul. 14, 1994

[51] Int. Cl.⁶ .......................... H05K 1/18; H05K 7/04
[52] U.S. Cl. .................... 174/263; 174/266; 174/261; 361/752; 361/753
[58] Field of Search ............... 174/263, 262, 266, 261; 439/81, 82, 83; 361/767, 768, 752, 753, 808

[56] References Cited

U.S. PATENT DOCUMENTS 4,851,614  7/1989  Duncan, Jr. ....................... 174/68.5
5,326,937  7/1994  Watanabe ........................... 174/263

Primary Examiner—Leo P. Picard
Assistant Examiner—L. Thomas
Attorney, Agent, or Firm—J. Richard Konneker; James Huffman

[57] ABSTRACT

To facilitate a grounding connection between a circuit board and a chassis upon which it is to be mounted, a spaced series of unlined mounting holes are formed through the substrate portion of the circuit board between its top and bottom sides, and spaced series of grounding vias are formed through the substrate and positioned in a circular arrays around each of the mounting holes. Annular layers of a metallic plating material are formed on the opposite sides of the circuit board substrate, around the top and bottom ends of the unlined mounting holes, with the plating material being extended along the interior side surfaces of the vias between associated top and bottom annular plating material layers. Using solder masks placed on the opposite sides of the circuit board substrate, circular arrays of solder pads are formed on the outer side surfaces of the annular plating layers, with each solder pad array being interdigitated with the vias in one of the circular arrays thereof, and being horizontally offset from the vias. The bottom side of the circuit board is secured against a side of the chassis by extending metal mounting screws through the unlined mounting holes of the circuit board and threading the screws into corresponding holes in the chassis to press the bottom side solder pads of the circuit board against the chassis.

14 Claims, 1 Drawing Sheet

PRINTED CIRCUIT BOARD/CHASSIS GROUNDING APPARATUS AND METHODS

BACKGROUND OF THE INVENTION

The present invention relates generally to circuit board construction, and more particularly relates to apparatus and methods for forming an electrical grounding connection between a circuit board and a chassis to which it is secured.

When mounting a circuit board on a metal chassis, such as a printed circuit board mounted on a computer chassis, it is necessary to form an electrical grounding connection between the chassis and the ground plane of the circuit board. One previously used technique for effecting this circuit board/chassis grounding connection is to form a spaced series of metal-plated through mounting holes in the circuit board. During the subsequent wave soldering process, solder wicks up into the plated mounting holes and fills them. Before the holes can be used, the solder filling them must be reamed out. Mounting screws are then extended through the reamed-out holes and threaded into the underlying chassis. While this technique forms an adequate grounding connection between the circuit board and the chassis, it is considered undesirable due to the time required to ream out the solder-filled mounting holes which undesirably increases the overall fabrication cost of the circuit board.

In another conventional grounding technique, the mounting holes are left unlined, and connection to ground is achieved by forming a spaced series of metal-plated grounding holes or "vias" through the circuit board around each of the unlined mounting holes, with each of the vias extending through the circuit board ground plane. Metal plating layers are also formed on opposite side surfaces of the circuit board and electrically couple the opposite ends of the internal metal plating portions of the vias. During the subsequent soldering process, solder wicks into the vias and forms outwardly projecting solder grounding pads on their opposite ends along the top and bottom sides of the circuit board substrate.

The theory of this previously used grounding construction technique is that when the bottom side of the circuit board is placed against the chassis, and mounting screws are extended through the unlined mounting holes and threaded into the chassis, the bottom side solder grounding pads will be brought into forcible contact with the underlying chassis and thereby ground the circuit board thereto. While this method overcomes the added cost factor of the previously described grounding method, it has the inherent disadvantage that the thicknesses of the resulting solder pads on the bottom side of the circuit board cannot be accurately controlled due to the upward wicking of the solder into the grounding vias. This results in the bottom side solder grounding pads having varying thicknesses. Accordingly, this solder pad thickness variation at the circuit board/chassis grounding interface along the bottom side of the circuit board results in fewer grounding contacts being made to the chassis, thereby enabling large ground loops that pose problems from an emissions standpoint.

As can be readily seen from the foregoing, it would be desirable to provide improved apparatus and methods for forming a circuit board/chassis grounding connection that eliminate or at least substantially reduce the problems, limitations and disadvantages associated with conventional grounding techniques such as those generally described above. It is accordingly an object of the present invention to provide such improved apparatus and methods.

SUMMARY OF THE INVENTION

In carrying out principles of the present invention, in accordance with a preferred embodiment thereof, a circuit board is provided that incorporates therein a specially designed grounding structure that economically and reliably facilitates an electrical grounding connection between the circuit board and a chassis upon which the circuit board is operatively mounted.

The circuit board includes a dielectric substrate structure having first and second opposite sides and an interior ground plane. A preferably unlined mounting hole extends through the substrate structure between its opposite sides, and a spaced series of grounding vias extend through the substrate structure between its opposite sides, pass through the ground plane, and are offset from the mounting hole.

A metal plating material, preferably copper, is deposited on the substrate structure, the metal plating material having a first portion extending along the first side of the substrate structure around an end of the mounting hole, and second portions connected to the first metal plating portion and extending along the interior side surfaces of the grounding vias.

A spaced series of solder pads are formed on the outer side of the first metal plating portion and are offset from the grounding vias. The solder pads project outwardly beyond the first side of the substrate structure and have outer side portions lying generally in a plane. Representatively, the grounding vias are arranged in a circular array around the end of the mounting hole, and the solder pads are arranged in a circular array interdigitated with the array of grounding vias.

With the first side of the substrate structure facing a generally planar side surface portion of the chassis, the substrate structure mounting hole is aligned with a corresponding mounting hole in the chassis, and the outer side surfaces of the solder pads are positioned against the side surface portion of the chassis. A metal mounting screw, or other suitable fastening member, is extended through the aligned mounting holes and secured to the chassis to hold the solder pads in forcible contact with the side surface of the chassis. An electrical grounding connection is thus formed between the chassis and the circuit board ground plane sequentially through the solder pads, the first metal plating portion which electrically couples all of the second metal plating portions, and the second metal plating portions.

The use of the grounding structure of the present invention advantageously eliminates the previous costly and time consuming necessity of interiorly plating the mounting hole, filling the mounting hole with solder, and then reaming out the solder from the mounting hole. Additionally, since the solder pads are formed on the first metal plating portion, and are offset from the grounding vias, solder in the pads does not wick into the grounding vias. This facilitates the formation of the solder pads with essentially identical thicknesses transverse to the first side of the substrate structure. Accordingly, most if not all of the solder pads will contact the chassis, thereby eliminating the undesirable formation of large ground loops in the circuit board/chassis assembly.

DETAILED DESCRIPTION

Figure 1:
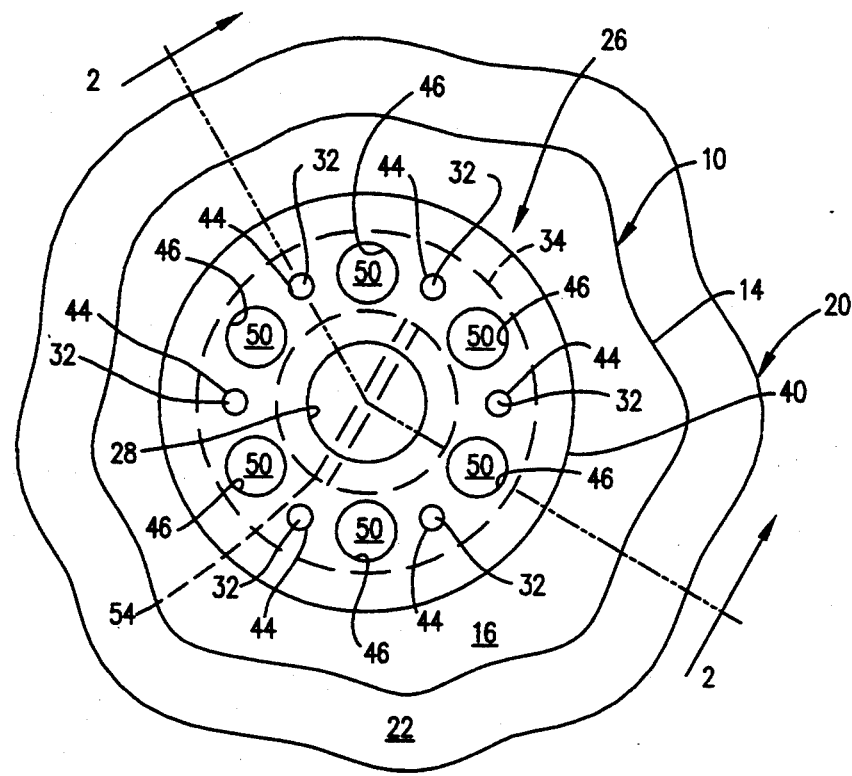
FIG. 1 is a top plan view of portions of a representative circuit board and chassis which are interconnected to one another using a specially designed grounding structure incorporated into the circuit board and embodying principles of the present invention.
Figure 2:
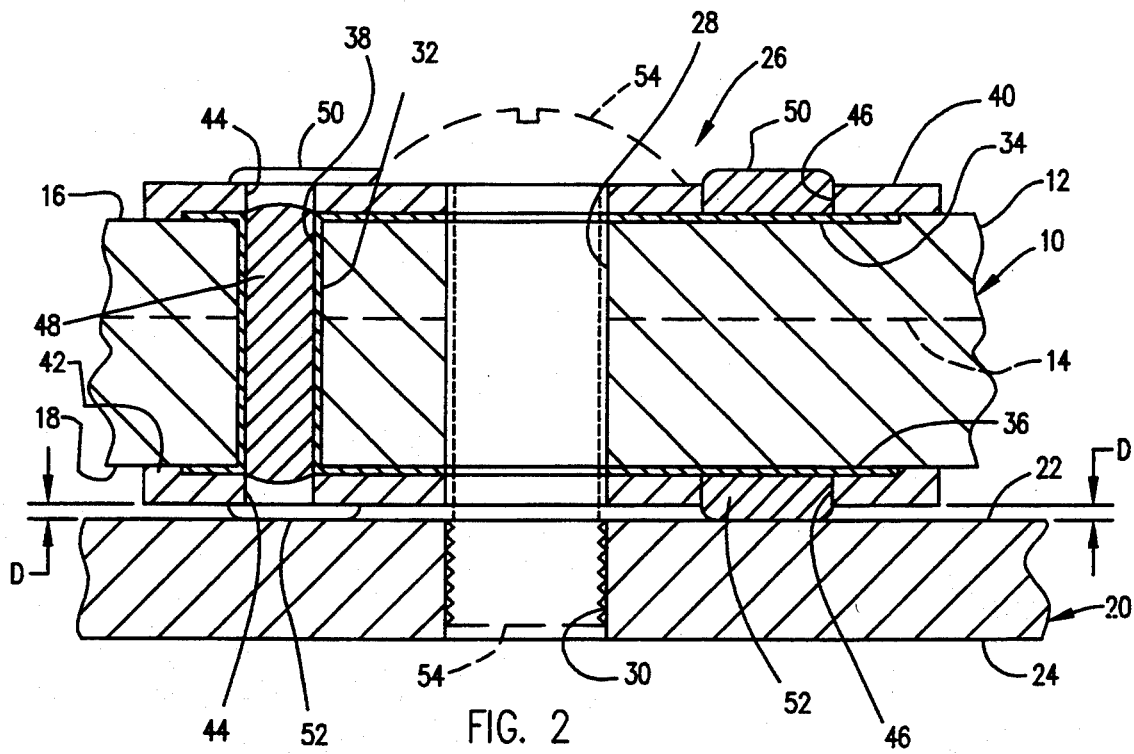
FIG. 2 is a simplified, enlarged scale cross-sectional view through the circuit board and chassis portions taken along line 2—2 of FIG. 1.

Illustrated in FIGS. 1 and 2 is a portion of a representative circuit board 10 that includes a dielectric substrate portion 12 through which a ground plane 14 interiorly extends, the substrate portion 12 having top and bottom sides 16 and 18. Underlying the circuit board 10 is a portion of a metal chassis 20 having top and bottom sides 22 and 24. In a manner subsequently described, the circuit board portion 10 is electrically grounded to the chassis portion 20 using a specially designed grounding structure 26 incorporated in the circuit board 10 and embodying principles of the present invention.

The grounding structure 26 includes a spaced series of circularly cross-sectioned, unlined mounting holes 28 (only one of which has been illustrated) formed through the substrate portion 12 of the circuit board. In the interconnected circuit board/chassis structure, these mounting holes 28 are aligned with and overlie corresponding circular mounting holes 30 (only one of which has been illustrated) formed in the chassis 20.

Circumferentially spaced around each circuit board mounting hole 28, and spaced radially outwardly therefrom, are a series of circularly cross-sectioned grounding vias 32 that extend between the top and bottom sides 16,18 of the substrate portion 12 and pass through the ground plane 14. After the holes 28 and 32 are formed through the substrate portion 12, a metal plating material (representatively copper) is appropriately deposited on the substrate portion 12 to form, at each of the mounting holes 28, (1) an annular metal layer 34 disposed on the top side 16 of the substrate portion 12 around the upper end of the unlined mounting hole 28, (2) an annular metal layer 36 disposed on the bottom side 18 of the substrate portion 12 around the bottom end of the unlined mounting hole 28, and (3) tubular vertical portions 38 interiorly lining the grounding vias 32 and connected at their top and bottom ends to the annular metal layers 34 and 36. With this metal plating material in place, each of the tubular plating portions 38 is electrically coupled to the ground plane 14, and around each of the unplated mounting holes 28 the tubular metal plating portions 38 are electrical coupled to one another by the top and bottom annular metal plating portions 34 and 36.

After the plating portions 34,36,38 are in place, annular solder masks 40,42 are respectively placed on the top and bottom sides of the substrate portion 12 around the top and bottom ends of the unlined mounting holes 28. As illustrated, the masks 40,42 radially extend outwardly past the peripheries of the top and bottom metal plating portions 34,36 and have circular holes 44 therein that are aligned with the top and bottom ends of the plated vias 32.

Additionally, a circumferentially spaced series of larger diameter circular holes 46 are formed in the masks 40 and 42. Holes 46 are circumferentially interdigitated with the holes 44, and outwardly overlie the annular metal plating portions 34 and 36 at locations thereon horizontally offset from the top and bottom ends of the grounding vias 32.

After the masks 40,42 are in place, solder is appropriately disposed on the top and bottom sides of the circuit board 10. Representatively, the solder is applied to the top side of the circuit board using a conventional IR reflow process, and applied to the bottom side of the circuit board using a conventional wave process. Portions 48 of the solder enter and fill the grounding vias 32, entering the vias through the mask holes 44, and portions of the solder flow through the larger diameter mask holes 46 and form circular solder pads 50 on the top annular plating portion 34, and circular solder pads 52 on the bottom annular plating portion 36. As best illustrated in FIG. 2, the solder pads 50,52 vertically project outwardly beyond their associated masks 40 and 42. Like their associated mask holes 46, the solder pads 50,52 are horizontally offset from the top and bottom ends of the grounding vias 32.

To very efficiently and reliably ground the circuit board 10 to the chassis 20, the circuit board 10 is placed atop the chassis 20 as illustrated in FIG. 2, and metal mounting screws 54 are extended downwardly through the unlined mounting holes 28 and threaded into the underlying chassis holes 30 to press the bottom side solder pads 52 against the top side 22 of the chassis 20. In this manner the chassis 20 is electrically coupled to the circuit board ground plane 14 sequentially through the solder pads 52, the bottom annular metal plating portion 36 and the grounding vias 32.

According to a key aspect of the present invention, due to the fact that the solder pads 52 are horizontally offset from the bottom ends of the vias 32, during the application of solder to the bottom side of the circuit board 10, solder entering the holes 46 in the bottom mask 42 to form the solder pads 52 does not wick upwardly into the bottom ends of the vias 32. Accordingly, the bottom sides of the solder pads 52 project downwardly a uniform distance D beyond the bottom side of the lower mask 42. Thus, most if not all of the solder pads 52 will engage the top side 22 of the chassis portion 20 when the screws 54 are tightened into the chassis holes 30 as illustrated in FIG. 2. This, in turn, desirably eliminates the potential creation of large ground loops in the overall grounding structure caused by failure of a substantial number of the grounding pads to contact the chassis.

The grounding structure 26 described above provides for the reliable grounding of the circuit board 10 to the underlying chassis by enabling the bottom solder pads 52 to be easily formed at a uniform thickness using conventional soldering techniques. Since the pads 52 are offset from the vias 32, the solder in the pads 52 cannot wick upwardly into the vias 32 to degrade this thickness uniformity. Incorporating the grounding structure 26 into the representative circuit board 10 does not appreciably increase the fabrication cost of the circuit board 10 or the assembly cost of the illustrated circuit board/chassis assembly.

The foregoing detailed description is to be clearly understood as being given by way of illustration and example only, the spirit and scope of the present invention being limited solely by the appended claims.

What is claimed is:

1. Circuit board apparatus comprising:

a circuit board substrate structure having first and second opposite sides and an interior ground plane, said circuit board substrate structure having a mounting hole extending therethrough between said first and second opposite sides, and a spaced series of grounding vias extending through said substrate structure between said first and second opposite sides, passing through said ground plane, and being offset from said mounting hole;

a metal plating material disposed on said substrate structure, said metal plating material having a first portion extending along said first side of said substrate structure around an end of said mounting hole, and second portions connected to said first portion and extending along the interior side surfaces of said grounding vias; and a spaced series of solder pads formed on said first portion of said metal plating material and offset from said grounding vias, said solder pads projecting outwardly beyond said first side of said substrate structure, having outer side portions lying generally in a plane, and being positionable against a side of a chassis portion upon which said circuit board may be mounted.

2. The circuit board apparatus of claim 1 wherein:
said first portion of said metal plating material has a generally annular configuration,
said spaced series of grounding vias are arranged in a generally circular array around said mounting hole, and
said spaced series of solder pads are arranged in a generally circular array disposed on said first portion of said metal plating material and interdigitated with said spaced series of grounding vias.

3. The circuit board apparatus of claim 1 wherein:
said metal plating material is copper.

4. The circuit board apparatus of claim 1 wherein:
said mounting hole is unlined.

5. The circuit board apparatus of claim 1 wherein:
said metal plating material further has a third portion extending along said second side of said substrate structure around the opposite end of said mounting hole and connected to said second portions of said metal plating material, and
said circuit board apparatus further comprises an additional spaced series of solder pads formed on said third portion of said metal plating material and offset from said grounding vias.

6. Electronic apparatus comprising:

a circuit board substrate structure having first and second opposite sides and an interior ground plane, said circuit board substrate structure having a mounting hole extending therethrough between said first and second opposite sides, and a spaced series of grounding vias extending through said substrate structure between said first and second opposite sides, passing through said ground plane, and being offset from said mounting hole;

a metal plating material disposed on said substrate structure, said metal plating material having a first portion extending along said first side of said substrate structure around an end of said mounting hole, and second portions connected to said first portion and extending along the interior side surfaces of said grounding vias;

a spaced series of solder pads formed on said first portion of said metal plating material and offset from said grounding vias, said solder pads projecting outwardly beyond said first side of said substrate structure and having outer side portions lying generally in a plane;

a chassis having a generally planar side surface portion facing said first side of said substrate structure and having a mounting hole extending inwardly through said side surface portion and being aligned with said mounting hole in said substrate structure; and a mounting member extending through said chassis and substrate structure mounting holes and pressing said outer side portions of said solder pads against said side surface portion of said chassis.

7. A method of fabricating circuit board apparatus comprising the steps of:

providing a circuit board substrate structure having first and second opposite sides, and an internal ground plane disposed between said first and second opposite sides;

forming in said substrate structure a mounting hole extending between said first and second opposite sides;

forming in said substrate structure a spaced series of grounding vias extending through said substrate structure between said first and second opposite sides thereof, passing through said ground plane, and being offset from said mounting hole;

depositing a metal plating material on said substrate structure, said metal plating material having a first portion extending along said first side of said substrate structure around an end of said mounting hole, and second portions connected to said first portion and extending along the interior side surfaces of said grounding vias; and depositing on the outer side of said first portion of said metal plating material a spaced series of solder pads, said solder pads being offset from said grounding vias and having outer side portions lying generally in a plane, said outer side portions of said solder pads being positionable against a generally planar side surface of a chassis portion upon which said substrate structure may be mounted.

8. Circuit board apparatus fabricated by the method of claim 7.

9. The method of claim 7 further comprising the steps of:

providing said first portion of said metal plating material with a generally annular configuration;

arranging said spaced series of grounding vias in a generally circular array around said mounting hole, and arranging said spaced series of solder pads in a generally circular array interdigitated with said spaced series of grounding vias.

10. Circuit board apparatus fabricated by the method of claim 9.

11. The method of claim 7 wherein:
said step of forming in said substrate structure a mounting hole is performed by forming an unlined mounting hole in said substrate structure.

12. Circuit board apparatus fabricated by the method of claim 11.

13. The method of claim 7 further comprising the steps of:

forming a third portion of said metal plating material on said substrate structure, said third portion extending along said second side of said substrate structure around the opposite end of said mounting hole and connected to said second portions of said metal plating material, and forming an additional spaced series of solder pads on said third portion of said metal plating material, said additional spaced series of solder pads being offset from said grounding vias.

14. Circuit board apparatus fabricated by the method of claim 13.

* * * * *